United States Patent
Chiu et al.

(10) Patent No.: US 8,138,517 B2
(45) Date of Patent: Mar. 20, 2012

(54) LIGHT-EMITTING DIODE PACKAGE

(75) Inventors: Yi-Tine Chiu, Taipei (TW);
Chung-Chuan Hsieh, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 406 days.

(21) Appl. No.: 12/331,452

(22) Filed: Dec. 10, 2008

(65) Prior Publication Data

US 2009/0146157 A1    Jun. 11, 2009

(30) Foreign Application Priority Data

Dec. 10, 2007 (TW) ................................ 96220959 U (51) Int. Cl.
*H01L 33/00* (2010.01)
(52) U.S. Cl. .............. 257/99; 257/100; 257/E33.057; 257/E33.058; 257/E33.059
(58) Field of Classification Search .......... 257/99, 257/100, E33.057, E33.058, E33.059
See application file for complete search history.

(56) References Cited

U.S. PATENT DOCUMENTS

| | | | | |
|---|---|---|---|---|
| 6,486,543 | B1 * | 11/2002 | Sano et al. ............... | 257/684 |
| 7,800,304 | B2 * | 9/2010 | Norfidathul et al. ........ | 313/512 |
| 2010/0244080 | A1 * | 9/2010 | Kim ........................ | 257/98 |
| 2010/0244731 | A1 * | 9/2010 | Kaihotsu et al. ........... | 315/294 |
| 2010/0264448 | A1 * | 10/2010 | Choi et al. ................. | 257/98 |
| 2010/0301371 | A1 * | 12/2010 | Roth et al. ................ | 257/98 |
| 2010/0320485 | A1 * | 12/2010 | Norfidathul et al. ........ | 257/88 |

FOREIGN PATENT DOCUMENTS

| | | |
|---|---|---|
| JP | 5-243442 | 9/1993 |
| JP | 8-306501 | 11/1996 |
| JP | 11-330131 | 11/1999 |
| JP | 2000-040781 | 2/2000 |
| JP | 2002-222993 | 8/2002 |
| JP | 2002-223002 | 8/2002 |
| JP | 2002-223005 | 8/2002 |
| JP | 2004-214380 | 7/2004 |
| JP | 2005-191530 | 7/2005 |
| JP | 2005-260276 | 9/2005 |
| JP | 2006-024794 | 1/2006 |
| JP | 2008-235826 | 10/2008 |
| JP | 2009-021472 | 1/2009 |

OTHER PUBLICATIONS

"Office Action of Japan Counterpart Application", issued on Jun. 7, 2011, p. 1-p. 4.

* cited by examiner

*Primary Examiner* — Ngan Ngo
(74) *Attorney, Agent, or Firm* — Jianq Chyun IP Office (57) ABSTRACT

An LED package is provided. The LED package includes a leadframe having a pair of first electrodes and a pair of second electrodes, an LED chip disposed on the leadframe, and an encapsulant encapsulating a portion of the leadframe and the LED chip. The pair of first electrodes and the pair of second electrodes are electrically connected with the LED chip. The pair of first electrodes and the pair of second electrodes are located outside the encapsulant. The encapsulant has a top surface, a bottom surface, a first side surface and a second side surface opposite to the first side surface, wherein the pair of first electrodes extend from the first side surface to the bottom surface, and the pair of second electrodes extend from the second side surface to the bottom surface.

18 Claims, 9 Drawing Sheets

LIGHT-EMITTING DIODE PACKAGE

CROSS-REFERENCE TO RELATED APPLICATION

This application claims the priority benefit of Taiwan application serial No. 96220959, filed on Dec. 10, 2007. The entirety of the above-mentioned patent application is hereby incorporated by reference herein and made a part of this specification.

BACKGROUND OF THE INVENTION

1. Field of the Invention

The present invention generally relates to a light-emitting diode (LED) package. More particularly, the present invention relates to a leadframe type LED package.

2. Description of Related Art

Due to the advantages of long lifespan, no idling time, quick response speed (approximately $10^{-9}$ seconds), compact volume, low power-consumption, low pollution, and high reliability, LED packages have been widely used in illumination apparatuses, back-lights of displays, or other electronic devices (e.g. traffic lights, cellular phones, scanners, fax machines, etc). Generally, LED packages are classified into top-view LED packages and side-view LED packages according to the orientation thereof. Specifically, when the a top-view LED package is mounted onto a circuit substrate, the chief-ray of the light emitted from the top-view LED package is substantially perpendicular to the circuit substrate; when the a side-view LED package is mounted onto a circuit substrate, the chief-ray of the light emitted from the side-view LED package is substantially parallel to the circuit substrate. The outlines of the top-view LED package and the side-view LED package are quite different, especially the design of electrodes (leads) exposed outside the LED packages.

Since the chief-ray of the light emitted from the conventional side-view LED package is determined by the designs of the circuit substrate and electrodes (leads), the designs of the circuit substrate or electrodes (leads) must be modified if the direction of the chief-ray is required to change. However, modification of circuit substrate or electrodes (leads) of the side-view LED package is not cost-effective and is unfavorable to mass production.

SUMMARY OF THE INVENTION

The present invention is to provide an LED package favorable to mass production.

As embodied and broadly described herein, the present invention provides an LED package including a leadframe having a pair of first electrodes and a pair of second electrodes, an LED chip disposed on the leadframe, and an encapsulant encapsulating a portion of the leadframe and the LED chip. The pair of first electrodes and the pair of second electrodes are electrically connected with the LED chip. The pair of first electrodes and the pair of second electrodes are located outside the encapsulant. The encapsulant has a top surface, a bottom surface, a first side surface and a second side surface opposite to the first side surface, wherein the pair of first electrodes extend from the first side surface to the bottom surface, and the pair of second electrodes extend from the second side surface to the bottom surface.

According to an embodiment of the present invention, the pair of first electrodes include a first positive electrode and a first negative electrode electrically insulated from the first positive electrode, while the pair of second electrodes include a second positive electrode and a second negative electrode electrically insulated from the second positive electrode.

According to an embodiment of the present invention, the first positive electrode is electrically connected with the second positive electrode while the first negative electrode is electrically connected with the second negative electrode.

According to an embodiment of the present invention, the leadframe has a first connecting conductor and a second connecting conductor, the first connecting conductor is electrically connected between the first positive electrode and the second positive electrode, while the second connecting conductor is electrically connected between the first negative electrode and the second negative electrode.

According to an embodiment of the present invention, the first connecting conductor and the second connecting conductor are encapsulated by the encapsulant.

According to an embodiment of the present invention, the encapsulant has an identification mark for identifying the first positive electrode and the second positive electrode.

According to an embodiment of the present invention, each first electrode is bent to extend along the first side surface and the bottom surface, and each second electrode is bent to extend along the second side surface and the bottom surface.

According to an embodiment of the present invention, the encapsulant includes a housing having a cavity and a transparent material layer disposed in the cavity, wherein the LED chip and a portion of the leadframe in the cavity is encapsulated by the transparent material layer.

According to an embodiment of the present invention, the housing is opaque.

According to an embodiment of the present invention, the transparent material layer has phosphor distributed therein.

According to an embodiment of the present invention, a material of the housing is an insulating material.

According to an embodiment of the present invention, a material of the transparent material layer is an insulating material.

According to an embodiment of the present invention, the encapsulant has a first protruding portion located on the first side surface such that the pair of first electrodes are separated by the first protruding portion.

According to an embodiment of the present invention, the encapsulant has a second protruding portion located on the second side surface such that the pair of second electrodes are separated by the second protruding portion.

According to an embodiment of the present invention, the encapsulant has a third side surface and a fourth side surface opposite to the third side surface, the encapsulant has at least one recess located on the third side surface and/or the fourth side surface.

As embodied and broadly described herein, the present invention provides an light-emitting diode (LED) module including a circuit substrate and a plurality of LED packages mentioned above, wherein the LED packages are disposed on the circuit substrate.

According to an embodiment of the present invention, the LED packages are arranged in at least one row so as to provide at least one linear light source.

According to an embodiment of the present invention, the pair of first electrodes comprise a first positive electrode and a first negative electrode electrically insulated from the first positive electrode, while the pair of second electrodes comprise a second positive electrode and a second negative electrode electrically insulated from the second positive electrode.

According to an embodiment of the present invention, the circuit substrate has at least one positive connection pad and at least one negative connection pads, the positive connection pad between two adjacent LED packages is electrically connected with the first positive electrode and the second positive electrode simultaneously, and the negative connection pad between two adjacent LED packages is electrically connected with the first negative electrode and the second negative electrode simultaneously Since the LED package of the present invention is capable of functioning as a top-view LED package or a side-view LED package without modifying the design of electrodes, the LED package of the present invention is favorable to mass production.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 1:
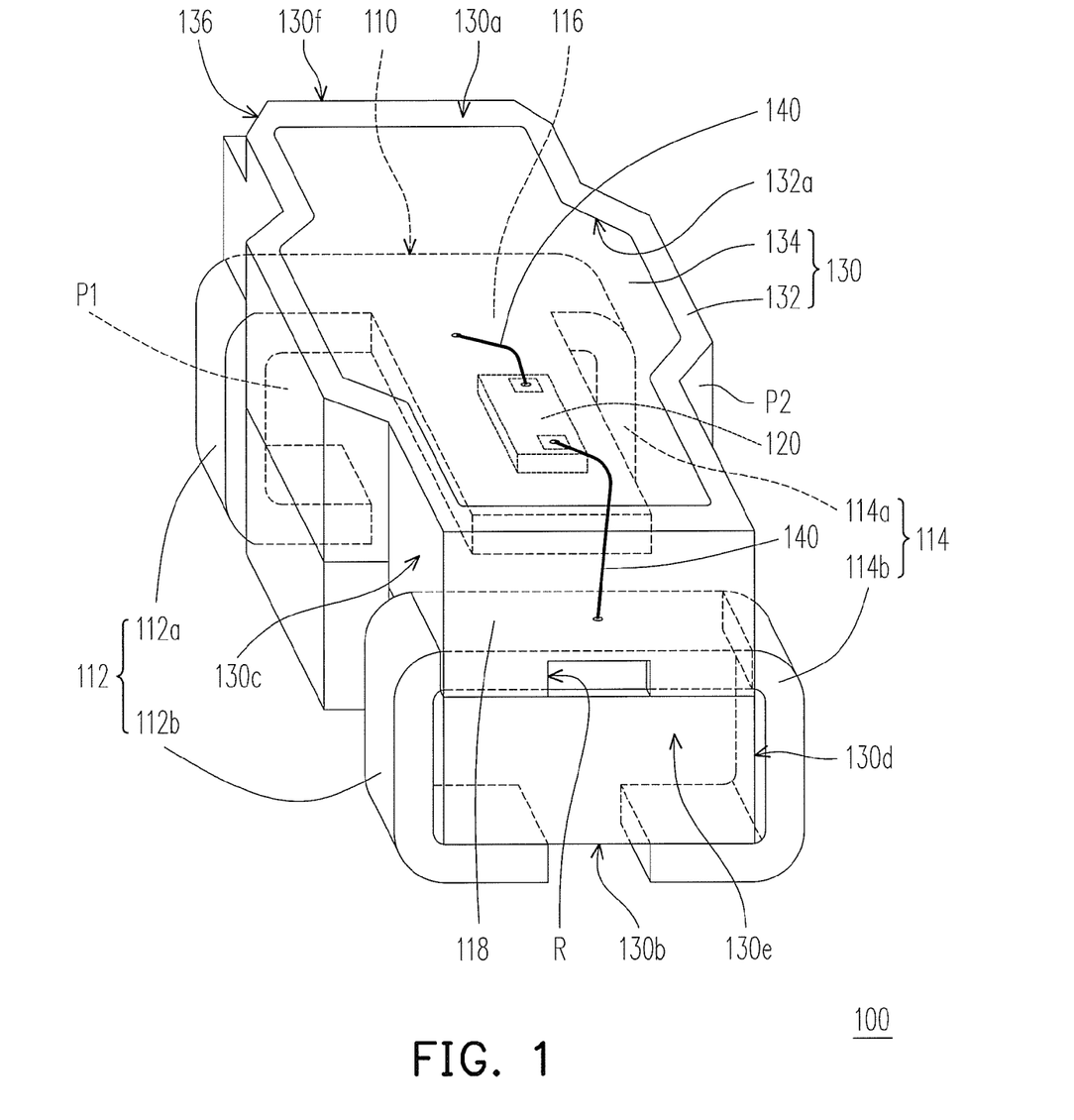
FIG. 1 is a schematic view illustrating an LED package according to an embodiment of the present invention.

FIG. 1 is a schematic view illustrating an LED package according to an embodiment of the present invention. Referring to FIG. 1, the LED package 100 of the embodiment includes a leadframe 110, an LED chip 120 disposed on the leadframe 110, and an encapsulant 130 encapsulating a portion of the leadframe 110 and the LED chip 120. The leadframe 110 has a pair of first electrodes 112 and a pair of second electrodes 114. The pair of first electrodes 112 and the pair of second electrodes 114 are electrically connected with the LED chip 120. The pair of first electrodes 112 and the pair of second electrodes 114 are located outside the encapsulant 130. The encapsulant 130 has a top surface 130a, a bottom surface 130b, a first side surface 130c and a second side surface 130d opposite to the first side surface 130c, wherein the pair of first electrodes 112 extend from the first side surface 130c to the bottom surface 130b, and the pair of second electrodes 114 extend from the second side surface 130d to the bottom surface 130b. Since the pair of first electrodes 112 and the pair of second electrodes 114 are exposed outside the encapsulant 130, heat generated from the LED chip 120 is conducted through the pair of first electrodes 112 and the pair of second electrodes 114 simultaneously and is dissipated rapidly via heat exchange. Accordingly, the LED package 100 having two pairs of electrodes (i.e. the first electrodes 112 and the second electrodes 114) exposed outside the encapsulant 130 has enhanced heat dissipation performance.

The LED package 100 is capable of serving as a top-view LED package or a side-view LED package without modifying the electrode design thereof, since each first electrode 112 is bent to extend along the first side surface 130c and the bottom surface 130b, and each second electrode 114 is bent to extend along the second side surface 130d and the bottom surface 130b.

As shown in FIG. 1, the pair of first electrodes 112 of the embodiment include a first positive electrode 112a and a first negative electrode 112b electrically insulated from the first positive electrode 112a, while the pair of second electrodes 114 include a second positive electrode 114a and a second negative electrode 114b electrically insulated from the second positive electrode 114a. The first positive electrode 112a is electrically connected with the second positive electrode 114a while the first negative electrode 112b is electrically connected with the second negative electrode 114b. In a preferred embodiment of the present invention, the leadframe 110 has a first connecting conductor 116 and a second connecting conductor 118, the first connecting conductor 116 is electrically connected between the first positive electrode 112a and the second positive electrode 114a, while the second connecting conductor 118 is electrically connected between the first negative electrode 112b and the second negative electrode 114b. In the embodiment, the leadframe 110 having the first electrodes 112, the second electrodes 114, the first connecting conductor 116, and the second connecting conductor 118 are formed by metal, such as copper, silver, or gold.

The first connecting conductor 116 and the second connecting conductor 118 are encapsulated by the encapsulant 130. For instance, the first connecting conductor 116 may serve as a die pad for carrying the LED chip 120 while the second connecting conductor 118 may serve as a wire-bonding pad such that the LED chip 120 is electrically connected with the second connecting conductor 118 via a bonding wire 140. Generally, the bonding wire 140 may be a gold wire formed by wire bonder. However, the electrical connection between the LED chip 120 and the leadframe 110 shown in FIG. 1 is merely for illustration; in other words, the LED chip 120 and the leadframe 110 may be electrically connected through more than one bonding wires or conductive bumps. In the present invention, the LED chip 120 may be a chip of any configuration, the number of pad(s) of the LED chip 120 for electrically connecting with the leadframe 110 may be one or more than one.

The encapsulant 130 includes a housing 132 having a cavity 132a and a transparent material layer 134 disposed in the cavity 132a of the housing 132, wherein the LED chip 120 and a portion of the leadframe 110 in the cavity 132a is encapsulated by the transparent material layer 134. The housing 132 is opaque so as to confine the propagation direction of the light emitted from the LED chip 120. Generally, the material of the housing 132 and the transparent material layer 134 is an insulating material.

In the embodiment, the transparent material layer 134 has yellow phosphor (e.g. yttrium aluminum garnet) distributed therein when the LED chip 120 disposed within the cavity 132a of the housing 132 is an LED chip for emitting blue light. In another embodiment of the present invention, the transparent material layer 134 has at least one kind of phosphor capable of being excited and emits required color light (e.g. red, green, and/or blue light, etc) distributed therein when the LED chip 120 disposed within the cavity 132a of the housing 132 is an LED chip for emitting light with short wavelength (e.g. ultraviolet light).

As shown in FIG. 1, the encapsulant 130 of the embodiment has an identification mark 136 for identifying the first positive electrode 112a and the second positive electrode 114a. Specifically, the identification mark 136 is helpful to differentiate the first positive electrode 112a from the first negative electrode 112b, or differentiate the second positive electrode 114a from the second negative electrode 114b. The identification mark 136 may be formed at a corner of the encapsulant 130, or other proper positions.

In order to prevent short circuit between the first positive electrode 112a and the first negative electrode 112b, a first protruding portion P1 may be formed on the first side surface 130c of the encapsulant 130 such that the pair of first electrodes 112 (i.e. the first positive electrode 112a and the first negative electrode 112b) are physically separated by the first protruding portion P1. Base on similar purpose, a second protruding portion P2 may be formed on the second side surface 130d of the encapsulant 130 such that the pair of second electrodes 114 (i.e. the second positive electrode 114a and the second negative electrode 114b) are physically separated by the second protruding portion P2.

As shown in FIG. 1, the encapsulant 130 has a third side surface 130e and a fourth side surface 130f opposite to the third side surface 130e, the encapsulant 130 has at least one recess R located on the third side surface 130e. It is noted that the recess R may be formed on the fourth side surface 130f, or on both the third side surface 130e and the fourth side surface 310f. In detail, an edge of the leadframe 110 is exposed by the recess R of the encapsulant 130.

FIG. 2A to FIG. 2D are schematic views illustrating an LED array having at least one top-view LED package according to an embodiment of the present invention. Referring to FIG. 2A to FIG. 2D, an LED array 200 of the present embodiment includes a circuit substrate 210 and a plurality of LED packages 100 (only one LED package 100 is shown in FIG. 2A to FIG. 2D). The LED package 100 is disposed on the circuit substrate 210 having a positive connection pad 212a and a negative connection pad 212b, wherein the first positive electrode 112a and the second positive electrode 114a are electrically connected with the positive connection pad 212a via a solder material S1, and the first negative electrode 112b and the second negative electrode 114b are electrically connected with the negative connection pad 212b via a solder material S2. It is noted that the first positive electrode 112a, the first negative electrode 112b, the second positive electrode 114a, and the second negative electrode 114b are all bonded with the circuit substrate 210 via the solder material S1 and S2, the bonding strength between the LED package 100 and the circuit substrate 210 is strong accordingly.

A first protruding portion P1 may be formed on the first side surface 130c of the encapsulant 130 such that the pair of first electrodes 112 (i.e. the first positive electrode 112a and the first negative electrode 112b) are physically separated by the first protruding portion P1. Base on similar purpose, a second protruding portion P2 may be formed on the second side surface 130d of the encapsulant 130 such that the pair of second electrodes 114 (i.e. the second positive electrode 114a and the second negative electrode 114b) are physically separated by the second protruding portion P2.

Figure 3A:
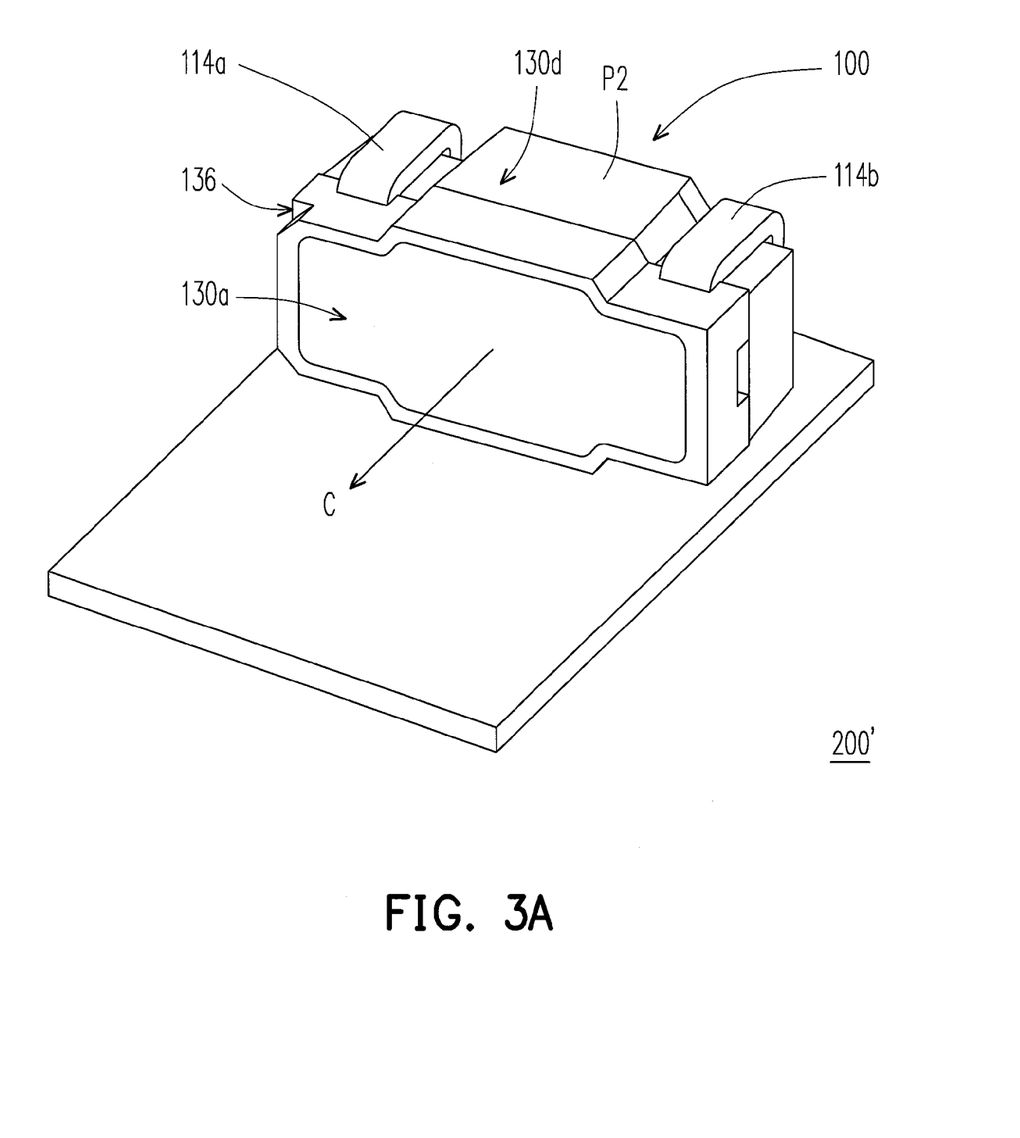
FIG. 3A to FIG. 3C are schematic views illustrating an LED array having at least one side-view LED package according to an embodiment of the present invention.
Figure 3B:
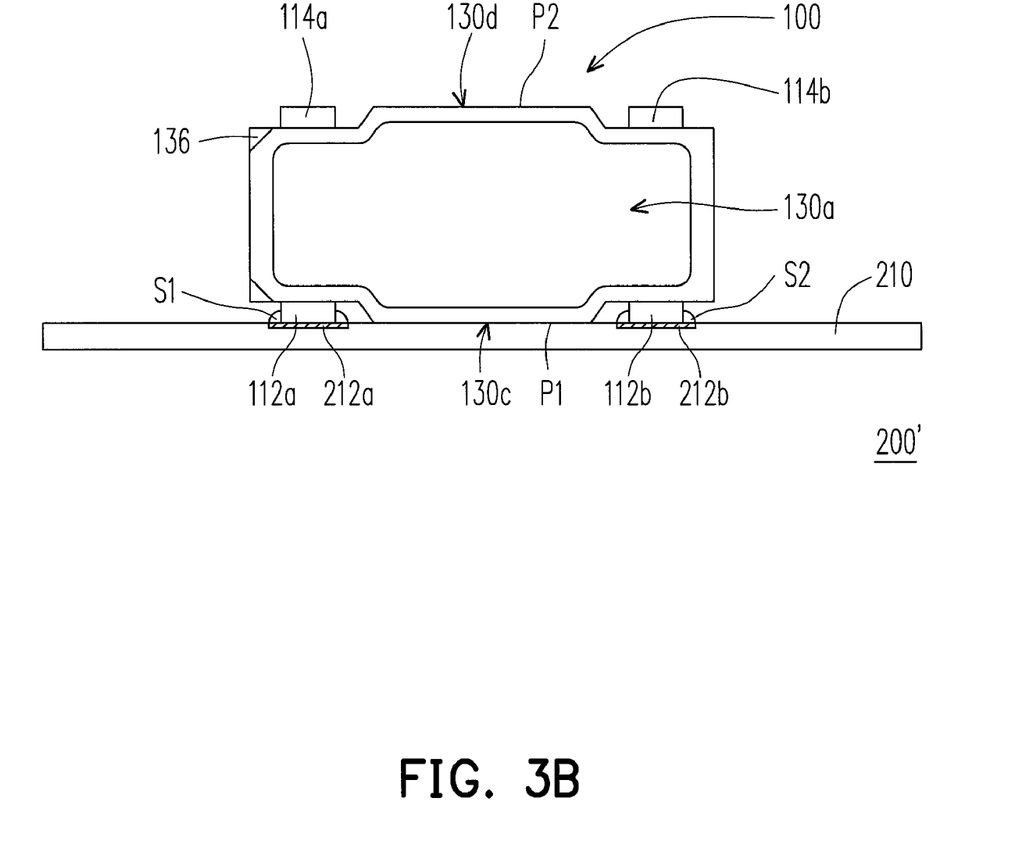
Figure 3C:
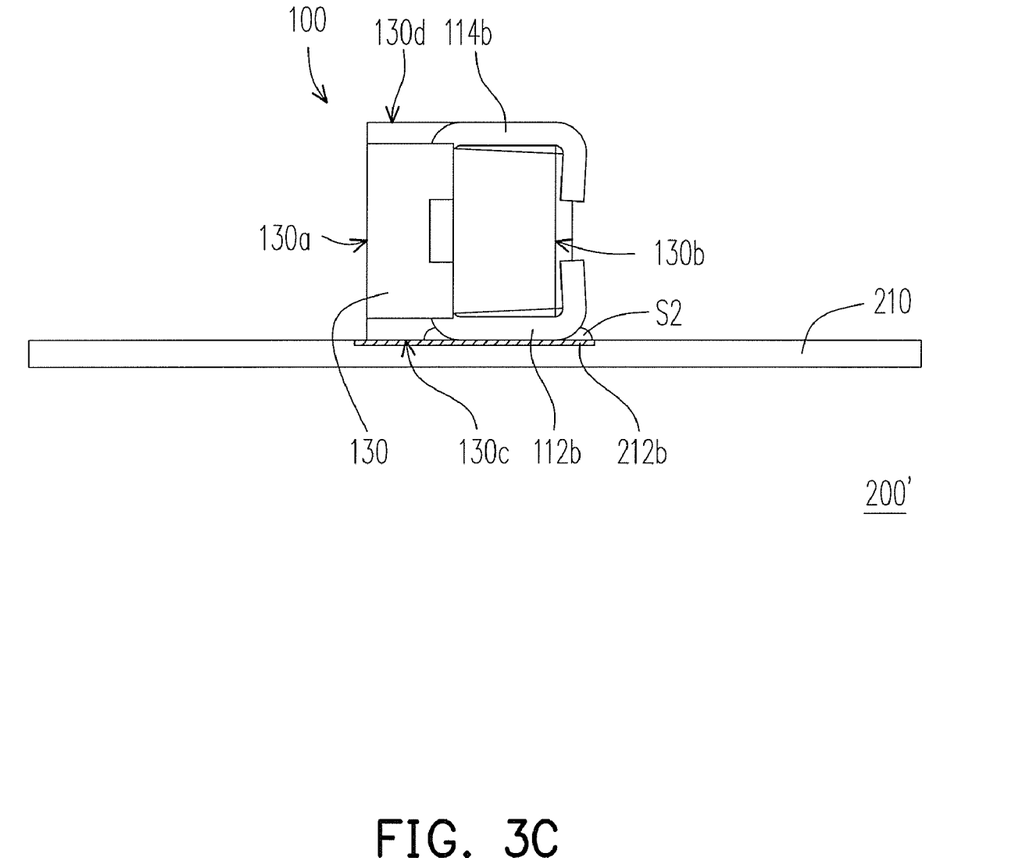

FIG. 3A to FIG. 3C are schematic views illustrating an LED array having at least one side-view LED package according to an embodiment of the present invention. Referring to FIG. 3A to FIG. 3C, an LED array 200' of the present embodiment includes a circuit substrate 210 and a plurality of LED packages 100 (only one LED package 100 is shown in FIG. 3A to FIG. 3C). The LED package 100 is disposed on the circuit substrate 210 having a positive connection pad 212a and a negative connection pad 212b, wherein only the first positive electrode 112a is electrically connected with the positive connection pad 212a via a solder material S1, and only the first negative electrode 112b is electrically connected with the negative connection pad 212b via a solder material S2.

As shown in FIG. 3A to FIG. 3C, the LED packages 100 is functioned as a side-view LED package, since the chief-ray C of the light emitted from the LED package 100 is substantially parallel to the circuit substrate 210.

Figure 2A:
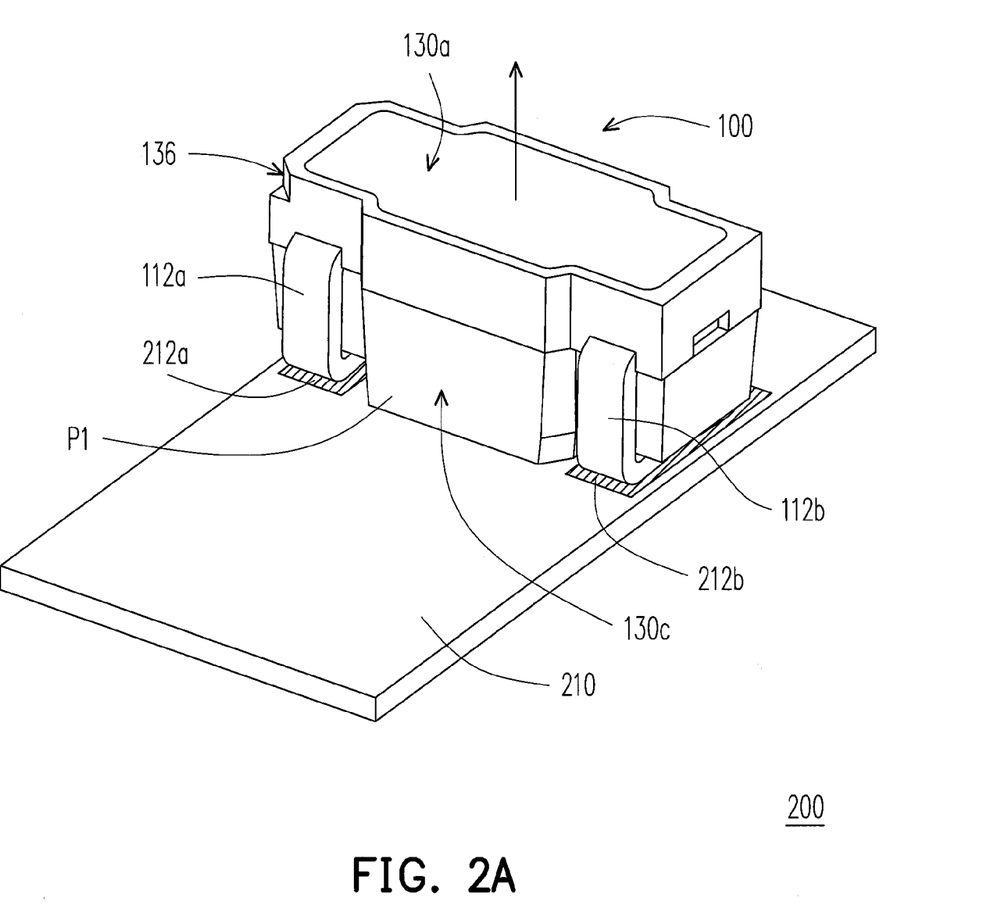
FIG. 2A to FIG. 2D are schematic views illustrating an LED array having at least one top-view LED package according to an embodiment of the present invention.
Figure 2B:
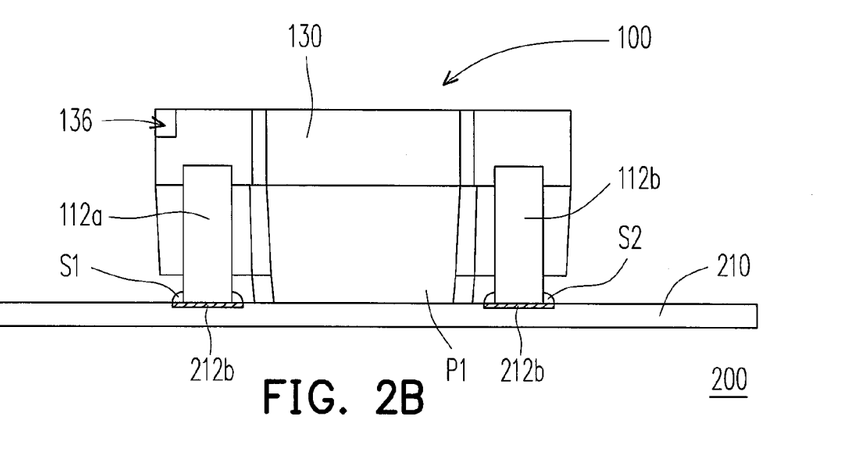
Figure 2C:
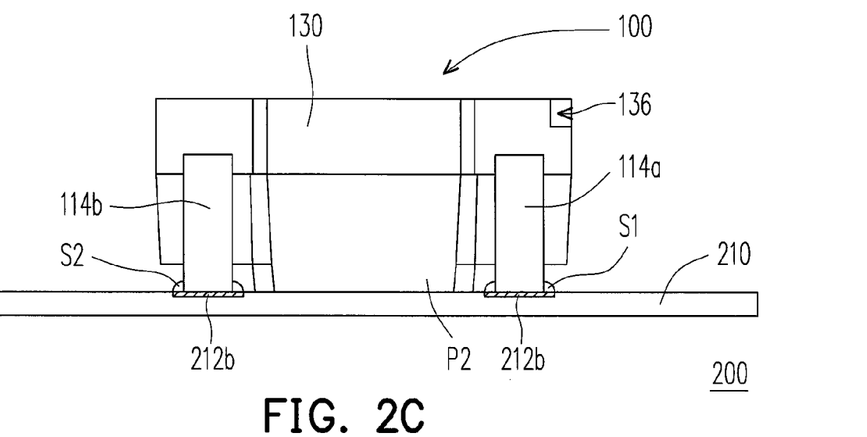
Figure 2D:
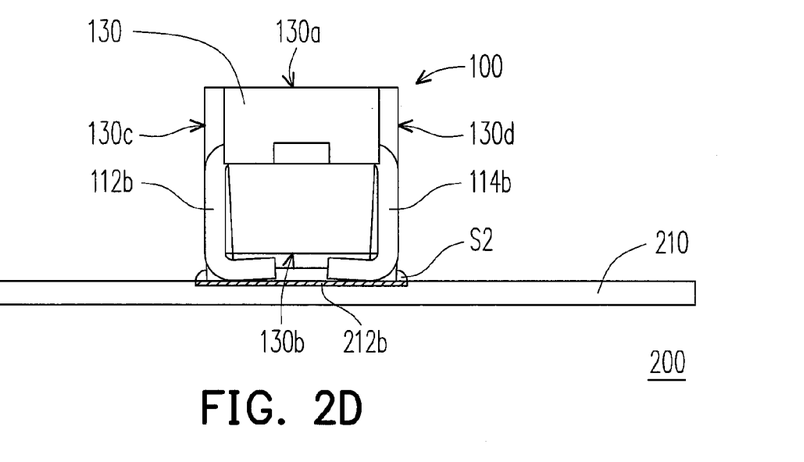

Referring to FIG. 2A and FIG. 3A, the LED packages 100 may be mounted onto the circuit substrate 210 in different orientations so as to provide side-view illumination or top-view illumination.

Figure 4:
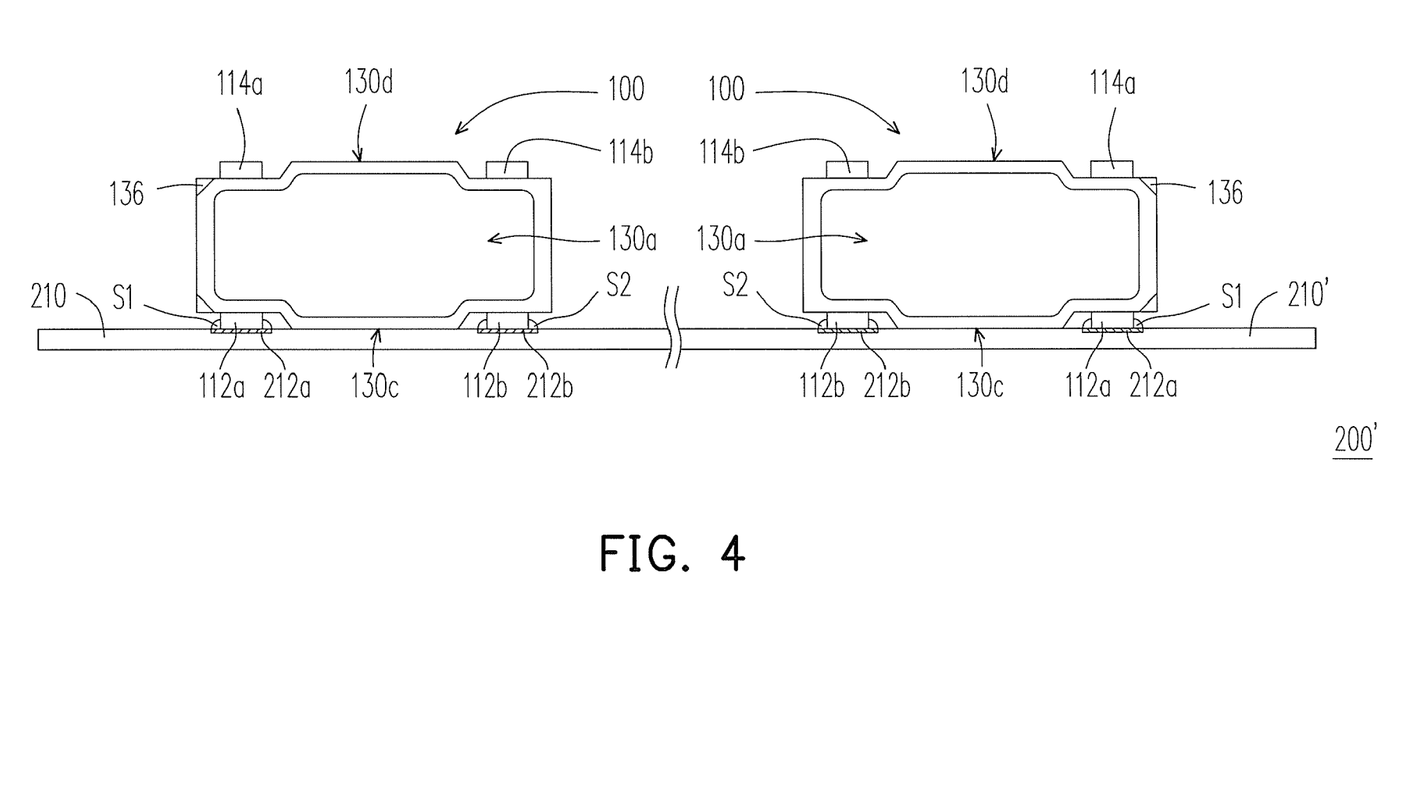
FIG. 4 is a schematic view illustrating two mounting orientations of the side-view LED packages on a circuit substrate according to an embodiment of the present invention.

FIG. 4 is a schematic view illustrating two mounting orientations of the side-view LED packages on a circuit substrate according to an embodiment of the present invention. Referring to FIG. 4, when the LED package 100 is mounted onto the circuit substrate 200, the first positive electrode 112a is electrically connected with the positive connection pad 212a via the solder material S1 while the first negative electrode 112b is electrically connected with the negative connection pad 212b via the solder material S2, such that the LED package 110 can provide a light propagating along a predetermined direction (shown in the left part of FIG. 4). However, different circuit substrates may have different layouts, for example, positions of the positive connection pad 212a and the negative connection pad 212b may be interchanges (shown in the right part of FIG. 4). Under the above-mentioned condition, the LED package 110 may be flipped and mounted onto the circuit substrate 210' such that the second positive electrode 114a is electrically connected with the positive connection pad 212a via the solder material S1 while the second negative electrode 114b is electrically connected with the negative connection pad 212b via the solder material S2. In this way, the LED package 100 mounted on the circuit substrate 210 and the LED package 100 mounted on the circuit substrate 210' are capable of providing light with the same propagating direction.

Figure 5:
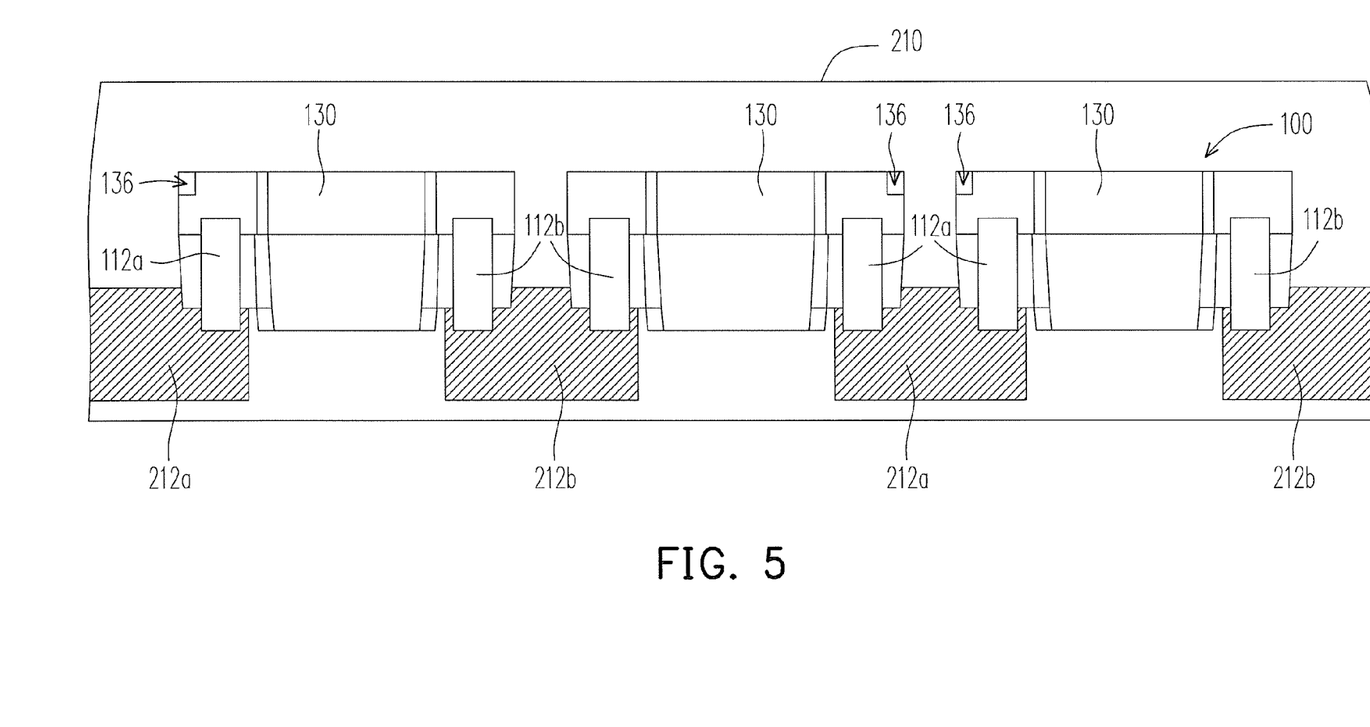
FIG. 5 is a top view illustrating an arrangement of the side-view LED packages on a circuit substrate according to an embodiment of the present invention.

FIG. 5 is a top view illustrating an arrangement of the side-view LED packages on a circuit substrate according to an embodiment of the present invention. Referring to FIG. 5, an LED module including a circuit substrate 210 and a plurality of LED packages 100 disposed on the circuit substrate 210 is provided, wherein the LED packages 100 on the circuit substrate 210 are arranged in one row so as to provide a linear light source. Each positive connection pad 212a between two adjacent LED packages 100 is electrically connected with the first positive electrode 112a and the second positive electrode 114a simultaneously. Each negative connection pad 212b between two adjacent LED packages 100 is electrically connected with the first negative electrode 112b and the second negative electrode 114b simultaneously.

Figure 6:
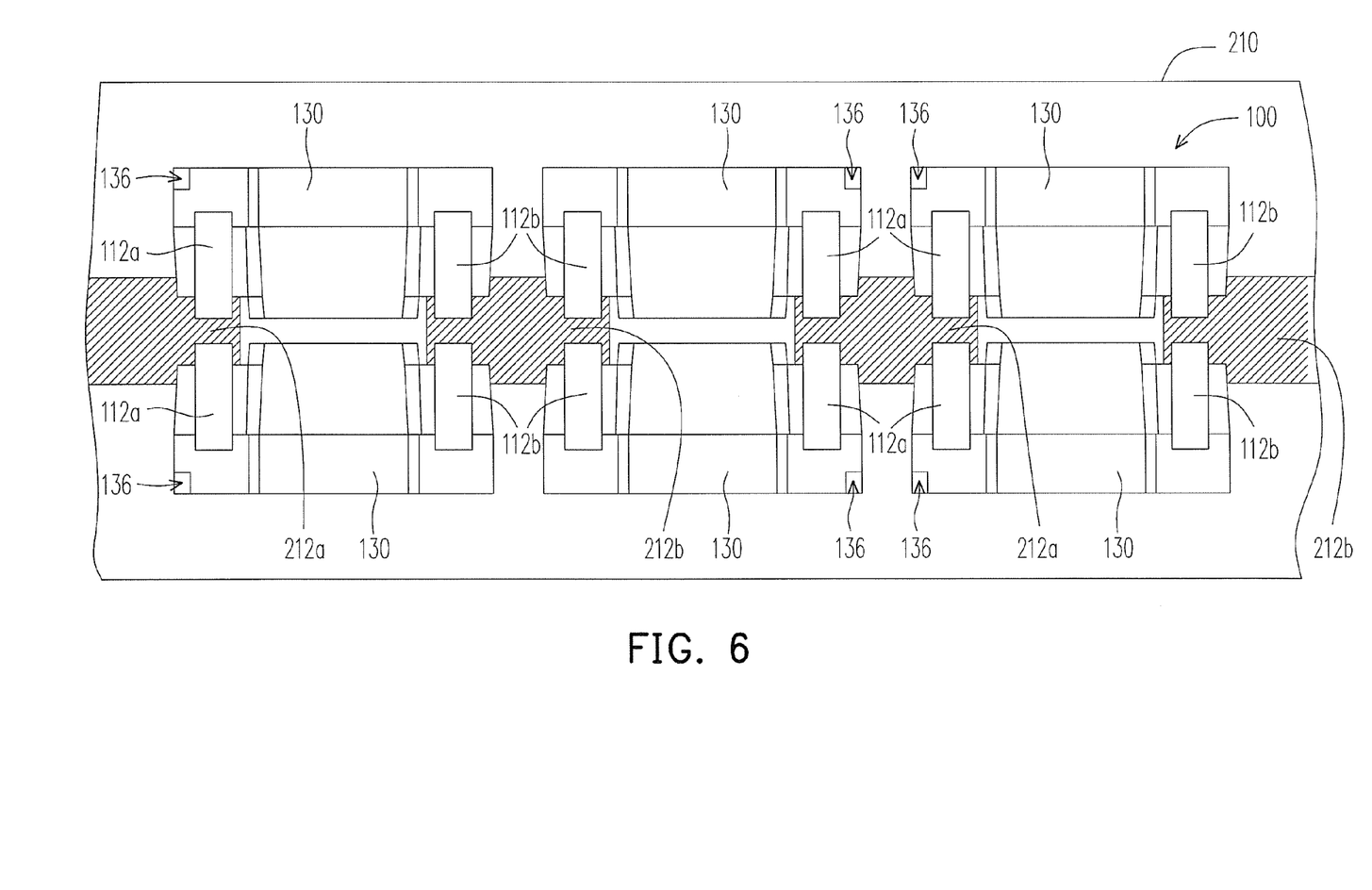
FIG. 6 is a top view illustrating an arrangement of the side-view LED packages on a circuit substrate according to another embodiment of the present invention.

FIG. 6 is a top view illustrating an arrangement of the side-view LED packages on a circuit substrate according to another embodiment of the present invention. Referring to FIG. 6, an LED module including a circuit substrate 210 and a plurality of LED packages 100 disposed on the circuit substrate 210 is provided, wherein the LED packages 100 on the circuit substrate 210 are arranged in two rows so as to provide two linear light sources. Each positive connection pad 212a between two adjacent LED packages 100 is electrically connected with two first positive electrodes 112a and two second positive electrodes 114a simultaneously. Each negative connection pad 212b between two adjacent LED packages 100 is electrically connected with two first negative electrodes 112b and two second negative electrodes 114b simultaneously. As shown in FIG. 5 and FIG. 6, the LED packages 100 can be arranged more compact.

To sum up, the LED package of the present invention is capable of being mounted on the circuit substrate in various orientations so as to provide side-view illumination or top-view illumination.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode (LED) package, comprising:
    a leadframe having a pair of first electrodes and a pair of second electrodes;
    an LED chip disposed on the leadframe, the pair of first electrodes and the pair of second electrodes being electrically connected with the LED chip; and
    an encapsulant encapsulating a portion of the leadframe and the LED chip, the pair of first electrodes and the pair of second electrodes being located outside the encapsulant, the encapsulant having a top surface, a bottom surface, a first side surface, a second side surface opposite to the first side surface, a first protruding portion located on the first side surface, and a second protruding portion located on the second side surface, wherein the pair of first electrodes extend from the first side surface to the bottom surface, and the pair of second electrodes extend from the second side surface to the bottom surface;
    wherein the pair of first electrodes comprise a first positive electrode and a first negative electrode electrically insulated from the first positive electrode, while the pair of second electrodes comprise a second positive electrode and a second negative electrode electrically insulated from the second positive electrode.

2. The LED package according to claim 1, wherein the first positive electrode is electrically connected with the second positive electrode while the first negative electrode is electrically connected with the second negative electrode.

3. The LED package according to claim 2, wherein the leadframe has a first connecting conductor and a second connecting conductor, the first connecting conductor is electrically connected between the first positive electrode and the second positive electrode, while the second connecting conductor is electrically connected between the first negative electrode and the second negative electrode.

4. The LED package according to claim 3, wherein the first connecting conductor and the second connecting conductor are encapsulated by the encapsulant.

5. The LED package according to claim 1, wherein the encapsulant has an identification mark for identifying the first positive electrode and the second positive electrode.

6. The LED package according to claim 1, wherein each first electrode is bent to extend along the first side surface and the bottom surface, and each second electrode is bent to extend along the second side surface and the bottom surface.

7. The LED package according to claim 1, wherein the encapsulant comprises:
    a housing having a cavity; and
    a transparent material layer disposed in the cavity, wherein the LED chip and a portion of the leadframe in the cavity is encapsulated by the transparent material layer.

8. The LED package according to claim 7, wherein the housing is opaque.

9. The LED package according to claim 7, wherein the transparent material layer has phosphor distributed therein.

10. The LED package according to claim 7, wherein a material of the housing is an insulating material.

11. The LED package according to claim 7, wherein a material of the transparent material layer is an insulating material.

12. The LED package according to claim 1, wherein the pair of first electrodes are separated by the first protruding portion.

13. The LED package according to claim 1, wherein the pair of second electrodes are separated by the second protruding portion.

14. The LED package according to claim 1, wherein the encapsulant has a third side surface and a fourth side surface opposite to the third side surface, the encapsulant has at least one recess located on the third side surface or the fourth side surface.

15. The LED package according to claim 1, wherein the encapsulant has a third side surface and a fourth side surface opposite to the third side surface, the encapsulant has at least one recess located on the third side surface and the fourth side surface.

16. A light-emitting diode (LED) module, comprising:
    a circuit substrate; and
    a plurality of light-emitting diode (LED) packages electrically connected to the circuit substrate, each LED package comprising:
        a leadframe having a pair of first electrodes and a pair of second electrodes;
        an LED chip disposed on the leadframe, the pair of first electrodes and the pair of second electrodes being electrically connected with the LED chip; and
        an encapsulant encapsulating a portion of the leadframe and the LED chip, the pair of first electrodes and the pair of second electrodes being located outside the encapsulant, the encapsulant having a top surface, a bottom surface, a first side surface, a second side surface opposite to the first side surface, a first protruding portion located on the first side surface, and a second protruding portion located on the second side surface, wherein the pair of first electrodes extend from the first side surface to the bottom surface, and the pair of second electrodes extend from the second side surface to the bottom surface,
    wherein the pair of first electrodes comprise a first positive electrode and a first negative electrode electrically insulated from the first positive electrode, while the pair of second electrodes comprise a second positive electrode and a second negative electrode electrically insulated from the second positive electrode,
    wherein the pair of the first electrodes include a pair of first electrode portions disposed on the first side surface and a pair of second electrode portions disposed on the bottom surface;
    wherein when the pair of first electrode portions of the LED package is mounted to the circuit substrate, a side surface of the first protruding portion is contacted with the circuit substrate, and the LED package provides a side-view illumination;
    wherein when the pair of second electrode portions of the LED package is mounted to the circuit substrate, a bottom surface of the first protruding portion is contacted with the circuit substrate, and the LED package provide a top-view illumination.

17. The LED module according to claim 16, wherein the LED packages are arranged in at least one row so as to provide at least one linear light source.

18. The LED module according to claim 16, wherein the circuit substrate has at least one positive connection pad and at least one negative connection pads, the positive connection pad between two adjacent LED packages is electrically connected with the first positive electrode and the second positive electrode simultaneously, and the negative connection pad between two adjacent LED packages is electrically connected with the first negative electrode and the second negative electrode simultaneously.

* * * * *